(12) United States Patent
Chen et al.

(10) Patent No.: US 9,595,340 B2
(45) Date of Patent: Mar. 14, 2017

(54) NONVOLATILE MEMORY DEVICE AND METHOD OF SETTING A REFERENCE CURRENT IN A NONVOLATILE MEMORY DEVICE

(71) Applicant: Taiwan Semiconductor Manufacturing Company Limited, Hsinchu (TW)

(72) Inventors: Hsu-Shun Chen, Miaoli County (TW); Gu-Huan Li, Hsinchu County (TW); Cheng-Hsiung Kuo, Hsinchu County (TW); Yue-Der Chih, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/600,102

(22) Filed: Jan. 20, 2015

(65) Prior Publication Data

US 2016/0211030 A1    Jul. 21, 2016

(51) Int. Cl.
| | | |
|---|---|---|
| G11C 16/04 | (2006.01) | |
| G11C 16/28 | (2006.01) | |
| G11C 16/30 | (2006.01) | |
| G11C 7/04 | (2006.01) | |
| G11C 7/06 | (2006.01) | |
| G11C 7/14 | (2006.01) | |

(52) U.S. Cl.
CPC ............. *G11C 16/28* (2013.01); *G11C 7/04* (2013.01); *G11C 7/062* (2013.01); *G11C 7/14* (2013.01); *G11C 16/30* (2013.01)

(58) Field of Classification Search
CPC ......... G11C 16/28; G11C 16/30; G11C 16/10; G11C 16/0416
See application file for complete search history.

(56) References Cited

U.S. PATENT DOCUMENTS

| | | | | |
|---|---|---|---|---|
| 2008/0013379 A1* | 1/2008 | Lin | ............... | G11C 7/12 |
| | | | | 365/185.21 |
| 2008/0043525 A1* | 2/2008 | Syzdek | ............... | G11C 7/062 |
| | | | | 365/185.2 |
| 2008/0164938 A1* | 7/2008 | Oberhuber | ............... | G05F 3/30 |
| | | | | 327/543 |
| 2009/0231925 A1* | 9/2009 | Mu | ............... | G11C 7/14 |
| | | | | 365/185.21 |
| 2010/0253303 A1* | 10/2010 | Chern | ............... | G05F 1/56 |
| | | | | 323/282 |

* cited by examiner

*Primary Examiner* — Son Dinh
*Assistant Examiner* — Uyen B Tran
(74) *Attorney, Agent, or Firm* — Jones Day

(57) ABSTRACT

A nonvolatile memory device comprises a cell array including a memory cell. The nonvolatile memory device also includes a reference signal generator configured to generate a reference current for reading data stored in the memory cell. The reference signal generator includes a first circuit coupled to a current summation node and having a reference cell. The first circuit is configured to generate a first current that flows between drain and source terminals of a transistor in the reference cell. The reference signal generator also includes a second circuit coupled to the current summation node and configured to generate a second current that is a temperature-dependent current. The current summation node is configured to combine the first and second currents to generate the reference current that tracks a temperature trend of a current flowing through the memory cell.

26 Claims, 8 Drawing Sheets

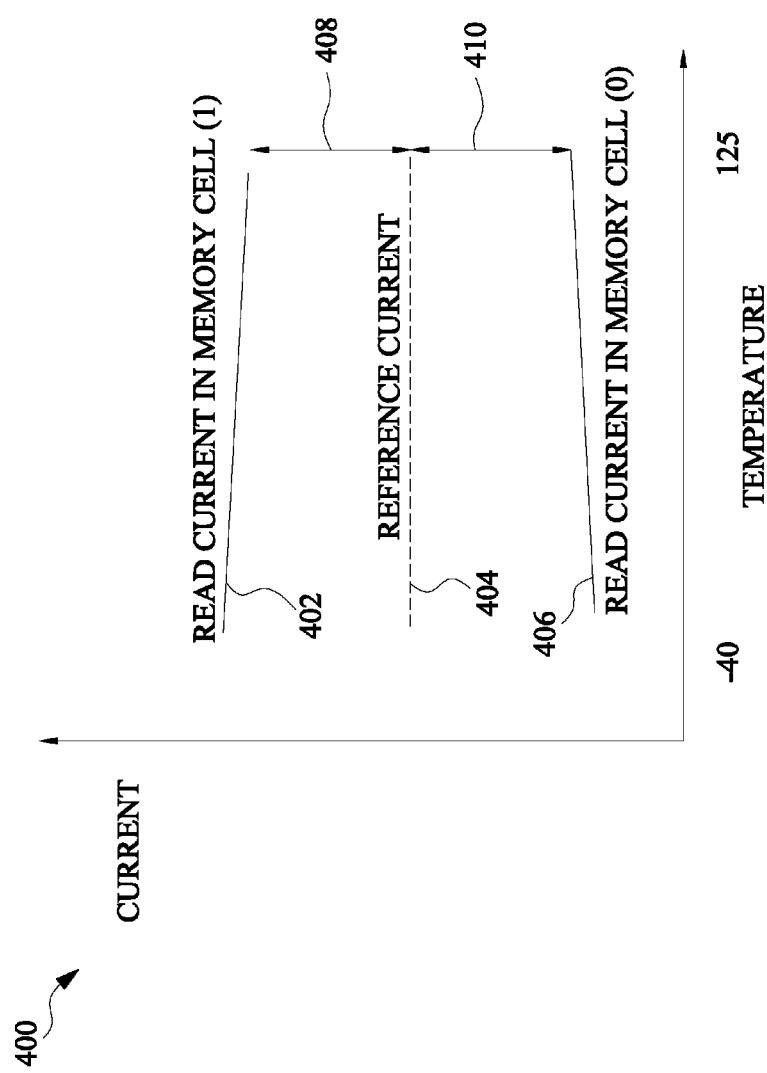

NONVOLATILE MEMORY DEVICE AND METHOD OF SETTING A REFERENCE CURRENT IN A NONVOLATILE MEMORY DEVICE

BACKGROUND

Nonvolatile memories are becoming increasingly popular in a wide range of electronic applications. For example, nonvolatile memories are commonly used in computer systems and mobile devices, such as cellular phones, personal digital assistants, cameras, and music players. Examples of nonvolatile memory include various types of read only memory (ROM), such as mask read only memory (MROM), programmable read only memory (PROM), and erasable programmable read only memory (EPROM). Other types of nonvolatile memory include flash memory and multiple time programmable (MTP) memory, among others.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A depicts a graph showing a reference current and read currents in a memory cell, in accordance with some embodiments.

DETAILED DESCRIPTION

Figure 1:
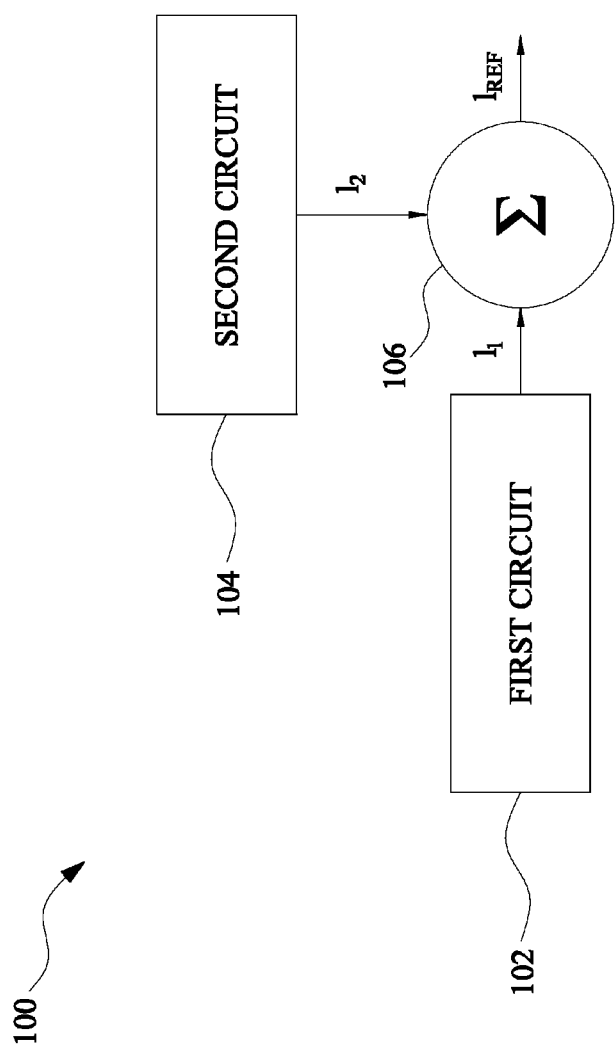
FIG. 1 depicts a block diagram of a reference signal generator of a nonvolatile memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 depicts a block diagram of a reference signal generator 100 of a nonvolatile memory device, in accordance with some embodiments. The reference signal generator 100 is configured to generate a reference current ($I_{REF}$) that is used in reading data stored in a memory cell of the nonvolatile memory device. The nonvolatile memory device includes, for example, flash memory, multiple time programmable (MTP) memory, or another type of nonvolatile memory. In general, reading data from the memory cell includes determining a logical state (i.e., logical "1" or logical "0") of data stored in the memory cell. A common method for making this determination uses a sense amplifier. In an example, both (i) a sensing current ($I_{CELL}$) flowing through the memory cell, and (ii) the reference current $I_{REF}$ are transmitted to the sense amplifier. The sense amplifier compares the sensing current $I_{CELL}$ to the reference current $I_{REF}$ and determines the logical state of the data stored in the memory cell based on the comparison. For example, if the sensing current $I_{CELL}$ is above the reference current $I_{REF}$, the memory cell is considered to be programmed (e.g., a logic level "0"), and if the sensing current $I_{CELL}$ is below the reference current $I_{REF}$, the memory cell is considered to be unprogrammed (e.g., a logic level "1").

To generate the reference current $I_{REF}$, the reference signal generator 100 of FIG. 1 includes a first circuit 102. The first circuit 102 is coupled to a current summation node 106 and includes a reference cell. The reference cell is an actual memory cell (i.e., a real cell) that is substantially identical to the memory cell storing the data to be read. In an example, the reference cell is physically identical to the memory cell storing the data to be read, thus causing the reference cell to exhibit similar current behavior as the memory cell and to track environmental conditions, process variation, and other characteristics of the memory cell. Additionally, in an example, the reference cell is biased in a manner similar to that of the memory cell storing the data to be read. This biasing further enables the current behavior of the reference cell to be similar to that of the memory cell.

Despite the similarity of the reference cell to the memory cell, a first current ($I_1$) generated by the first circuit 102 does not precisely track all aspects of the sensing current $I_{CELL}$ flowing through the memory cell. Specifically, the first current $I_1$ does not precisely track a temperature trend of the sensing current $I_{CELL}$ flowing through the memory cell. In an example, a temperature slope of the first current $I_1$ does not precisely track a temperature slope of the sensing current $I_{CELL}$, where the temperature slope defines a rate of change of a respective current with respect to a temperature of the nonvolatile memory device. An objective of a reference signal generator 100 is to generate a reference current that tracks with current changes in the memory cell with respect to process, temperature, and power supply variations. Thus, as described below, the first current $I_1$ is adjusted to generate the reference current $I_{REF}$ that adequately tracks with changes in the sensing current $I_{CELL}$.

To address the aforementioned differences in the temperature trends of the first current $I_1$ and the sensing current $I_{CELL}$, the reference signal generator 100 of FIG. 1 includes a second circuit 104. The second circuit 104, also referred to herein as a "temperature compensation circuit," is coupled to the current summation node 106 and is configured to generate a second current ($I_2$). The second current $I_2$ is a temperature dependent current (i.e., the second current $I_2$ varies as a temperature of the nonvolatile memory device changes) that is combined with the first current $I_1$ to generate the reference current $I_{REF}$ that tracks the temperature trend of the sensing current $I_{CELL}$.

Figure 3:
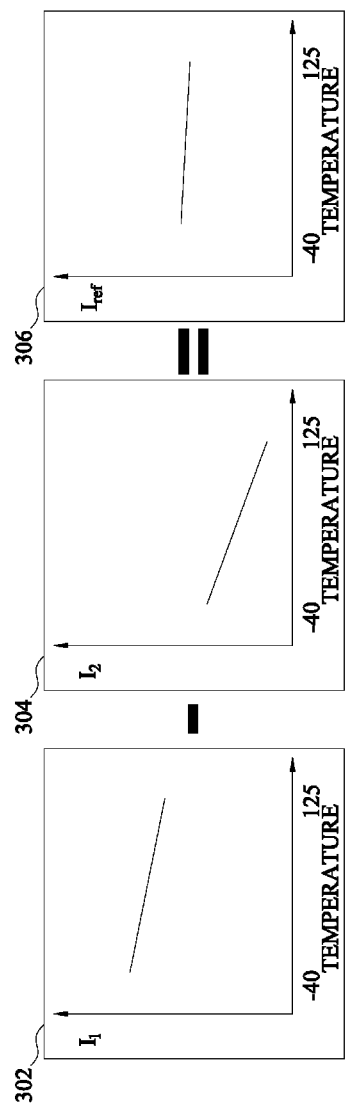
FIG. 3 depicts a combining of a first current with a second current to generate a reference current for a nonvolatile memory device, in accordance with some embodiments.
Figure 4B:
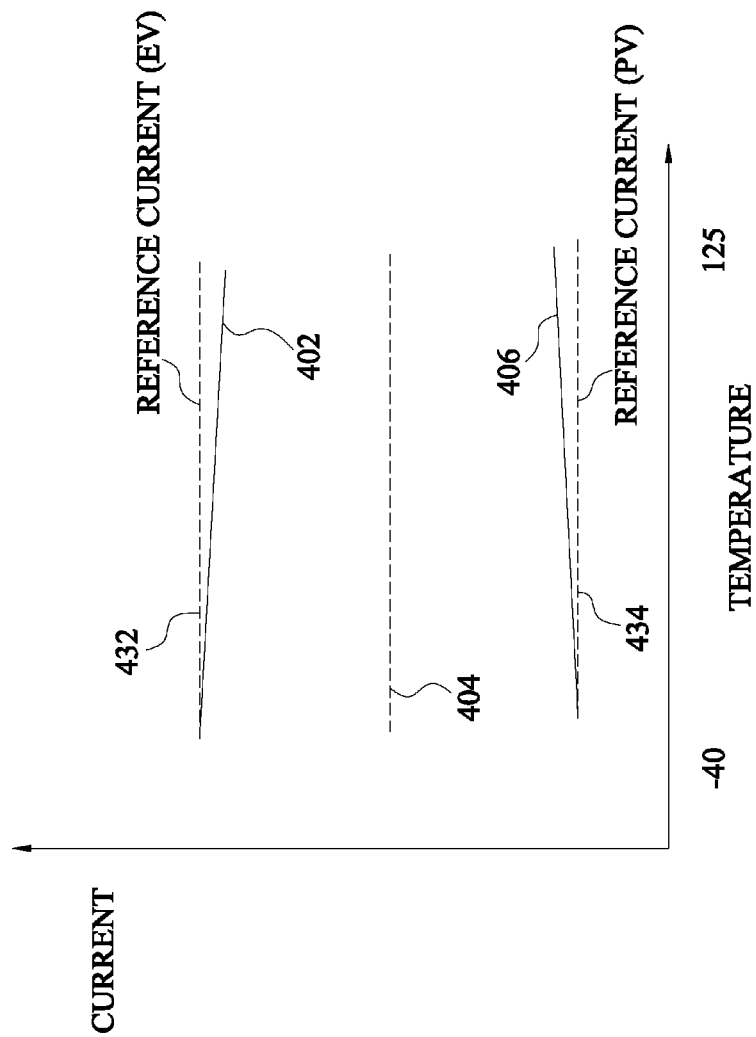
FIG. 4B depicts a graph showing reference currents for verifying that a cell has been programmed and verifying that the cell has been erased.

By combining the first and second currents $I_1$, $I_2$, a temperature slope of the reference current $I_{REF}$ approximates the temperature slope of the sensing current $I_{CELL}$. Aspects of the approximating of the temperature slope of the sensing current $I_{CELL}$ in the reference current $I_{REF}$ are illustrated in FIGS. 3, 4A, and 4B and explained in further detail below. It should be appreciated that the second current $I_2$ is a temperature compensation current configured to adjust the temperature trend of the first current $I_1$, with the resulting temperature-adjusted current being the reference current $I_{REF}$. The current summation node 106 combines the first and second currents $I_1$, $I_2$ to generate the reference current $I_{REF}$. In an example, the current summation node 106 sums the first and second currents $I_1$, $I_2$ to generate the reference current $I_{REF}$. In other examples, the current summation node 106 takes a difference between the first and second currents $I_1$, $I_2$ to generate the reference current $I_{REF}$.

Figure 2:
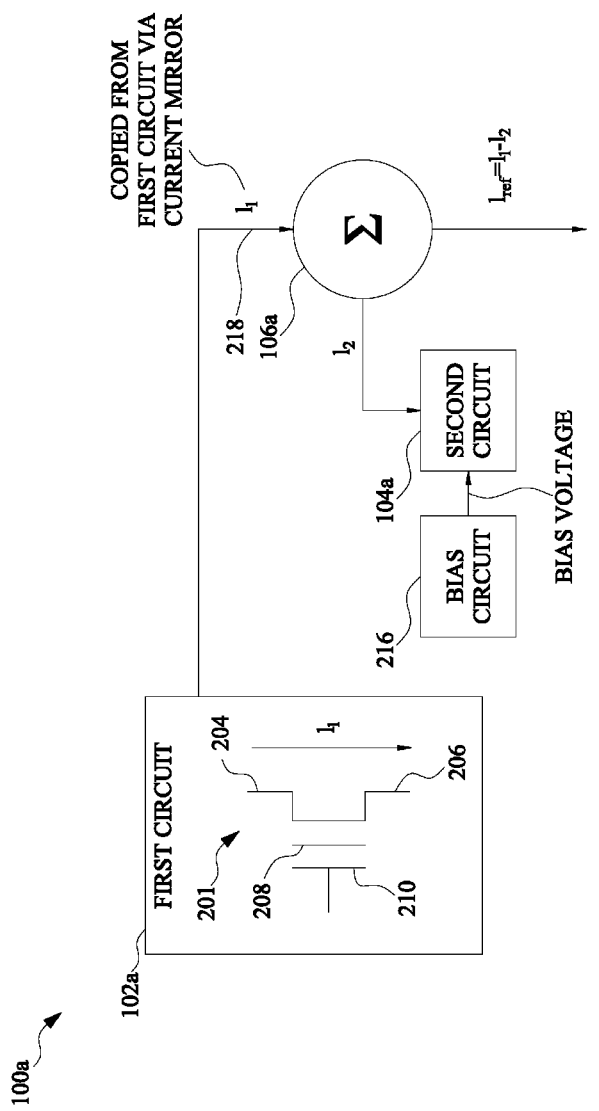
FIG. 2 depicts a block diagram of a reference signal generator including a first circuit, a second circuit, and a current summation node, in accordance with some embodiments.

FIG. 2 depicts a block diagram of a reference signal generator 100a including a first circuit 102a, a second circuit 104a, and a current summation node 106a, in accordance with some embodiments. The first circuit 102a is coupled to the current summation node 106a and includes a reference cell 201. The reference cell 201 comprises a conventional transistor used in nonvolatile memory and includes a drain 204, a source 206, a floating gate 208, and a control gate 210. The floating gate 208 is disposed between a substrate of the transistor and the control gate 210 and is isolated from the control gate 210 and the substrate by dielectric layers formed above and below the floating gate 208.

As described below, a reference current generated by the reference signal generator 100a is used to read data stored in a memory cell, and in an example, the reference cell 201 is substantially physically identical to the memory cell. Thus, in this example, the reference cell 201 has dimensions (e.g., transistor width, channel length, various thicknesses) that are substantially the same as those of the memory cell. Any physical differences between the reference cell 201 and the memory cell are naturally occurring variation in attributes resulting from the fabrication of the cells.

When used in storing data, the control gate 210 is coupled to a word-line, the drain 204 is coupled to a bit-line, and the source 206 is coupled to a ground reference voltage. Further, when used in storing data, the floating gate 208 functions as a data storage element that stores a variable amount of static charge, with the level of charge stored by the floating gate 208 representing a data value stored by the data storage element. It should be appreciated that the reference cell 201 is not used in storing data in the reference signal generator 100a. However, in order to generate a first current $I_1$ that has a similar current behavior as a current flowing through the memory cell to be read, the reference cell 201 is biased with voltages similar to those which would be provided via the word-line and the bit-line to the memory cell. The first circuit 102a is configured to generate the first current $I_1$ that flows between the drain and source terminals 204, 206 of the transistor in the reference cell 201.

In the reference signal generator 100a of FIG. 2, the second circuit 104a is coupled to the current summation node 106a and configured to generate a second current $I_2$. The second current $I_2$ is a temperature-dependent current that is combined with the first current $I_1$ to generate a reference current $I_{REF}$ that is used in reading data stored in the memory cell of a nonvolatile memory device. The reference current $I_{REF}$ tracks a temperature trend of a current flowing through the memory cell. As shown in FIG. 2, the current summation node 106a combines the first and second currents $I_1$, $I_2$ via a difference (i.e., subtraction) operation, with $I_{REF}$ being equal to $I_1$-$I_2$. FIG. 2 also illustrates that in an example, the first current $I_1$ is copied from the first circuit 102a to a branch 218 of the reference signal generator 100a using a current mirror. In the example, the copying of the first current $I_1$ to the branch 218 enables the first current $I_1$ to be received by the current summation node 106a.

The second circuit 104a receives a bias voltage from a bias circuit 216. The second current $I_2$ is a temperature-dependent current, as noted above, and a temperature dependence of the second current $I_2$ is based on the received bias voltage. In an example, the bias voltage applied to the second circuit 104a controls a temperature slope of the second current $I_2$, where the temperature slope of the second current $I_2$ defines a rate of change of the second current $I_2$ with respect to the temperature of the nonvolatile memory device. The bias circuit 216 includes a voltage regulator configured to generate the bias voltage, such that the bias voltage is a regulated voltage that is maintained at a substantially constant level. As explained in further detail below, the use of the voltage regulator helps to eliminate voltage corners (i.e., voltage variation effects) that could otherwise cause unwanted variation in the reference current $I_{REF}$.

In an example, the second circuit 104a includes only a single PMOS or NMOS transistor. In this example, the second circuit 104a does not include a resistor, and the second circuit 104a does not include a second PMOS or NMOS transistor. The lack of a resistor in the second circuit 104a and in other portions of the reference signal generator 100a helps to eliminate process, voltage, and temperature (PVT) variation effects that could otherwise cause unwanted variation in the reference current $I_{REF}$. In general, resistors are highly susceptible to PVT variation effects, and if the reference signal generator 100a included resistors, the PVT variation effects could cause the unwanted variation in the reference current $I_{REF}$. Lacking such resistors, the reference current $I_{REF}$ is less susceptible to such PVT variation effects.

As described above, in the example of FIG. 2, the reference current $I_{REF}$ is equal to the difference between the first and second currents $I_1$, $I_2$ (i.e., $I_{REF}=I_1-I_2$). FIG. 3 shows an example subtraction operation for combining the first and second currents $I_1$, $I_2$ to generate the reference current $I_{REF}$. In FIG. 3, a first graph 302 includes a y-axis representing the first current $I_1$ and an x-axis representing temperature. The first current $I_1$ is generated by a first circuit (e.g., first circuits 102, 102a illustrated in FIGS. 1 and 2, respectively) and comprises a current that flows between drain and source terminals of a transistor in a reference cell included in the first circuit. The temperature represented by the x-axis of the graph 302 is a temperature of a nonvolatile memory device including the first circuit. As shown in the first graph 302, the first current is a temperature-dependent current that exhibits variation with changing temperatures. Temperatures shown in the first graph 302 range from −40 degrees Fahrenheit to 125 degrees Fahrenheit.

The first current $I_1$ shown in the first graph 302 does not precisely track a temperature trend of a sensing current $I_{CELL}$ flowing through a memory cell to be read. Specifically, a temperature slope of the first current $I_1$ does not precisely track a temperature slope of the sensing current $I_{CELL}$, where the temperature slope defines a rate of change of a respective current with respect to a temperature of the nonvolatile memory device. To address the differences in the temperature trends of the first current $I_1$ and the sensing current $I_{CELL}$, a second current $I_2$ depicted in a second graph 304 is subtracted from the first current $I_1$ to generate a temperature-compensated reference current $I_{REF}$ shown in a third graph 306.

The second graph 304 includes a y-axis representing the second current $I_2$ and an x-axis representing the temperature of the nonvolatile memory device. The second current $I_2$ is generated by a second circuit (e.g., second circuits 104, 104a illustrated in FIGS. 1 and 2, respectively) and comprises a current that is to be combined with the first current $I_1$. As shown in the second graph 304, the second current $I_2$ is a temperature-dependent current that exhibits variation with changing temperatures. Temperatures shown in the second graph 304 range from −40 degrees Fahrenheit to 125 degrees Fahrenheit. In the example of FIG. 3, the second current $I_2$ decreases with increasing temperature of the nonvolatile memory device, and thus, the second circuit that generates the second current $I_2$ is a complementary-to-absolute temperature (CTAT) current source.

As described above with reference to FIG. 2, a bias voltage applied to the second circuit controls a temperature slope of the second current $I_2$, with the temperature slope defining a rate of change of the second current $I_2$ with respect to the temperature of the nonvolatile memory device. Thus, a slope of the curve depicted in the second graph 304 of FIG. 3 is based on this bias voltage.

Subtracting the second current $I_2$ shown in the second graph 304 from the first current $I_1$ shown in the first graph 302 yields the reference current $I_{REF}$ shown in the third graph 306. The third graph 306 includes a y-axis representing the reference current $I_{REF}$ and an x-axis representing the temperature of the nonvolatile memory device. The reference current $I_{REF}$ is generated by combining the first and second currents $I_1$, $I_2$ at a current summation node (e.g., current summation nodes 106, 106a illustrated in FIGS. 1 and 2, respectively). The reference current $I_{REF}$ illustrated in the third graph 306 is used in reading data stored in a memory cell of the nonvolatile memory device and tracks a temperature trend of a current flowing through the memory cell.

To illustrate the reference current's tracking of the temperature trend of the current flowing through the memory cell, FIG. 4A depicts a graph 400 showing the reference current 404 and read currents 402, 406 in the memory cell. The reference current 404 is a reference current generated by a reference signal generator (e.g., the reference signal generators 100, 100a of FIGS. 1 and 2, respectively) for reading data stored in the memory cell, and the read currents 402, 406 are currents that flow through the memory cell. In particular, the read current 402 is a current flowing through the memory cell when data stored in the memory cell has a logical state of "1," and the read current 406 is a current flowing through the memory cell when data stored in the memory cell has a logical state of "0."

As illustrated in the graph 400, each of the read currents 402, 406 and the reference current 404 exhibits variation with changing temperature. Variation over a temperature range of −40 degrees Fahrenheit to 125 degrees Fahrenheit is shown in FIG. 4. The temperature slope of the reference current 404 approximates the temperature slopes of the read currents 402, 406, and thus, the reference current 404 tracks the temperature trends of the read currents 402, 406. By tracking the temperature trends of the read currents 402, 406, the reference current 404 enables a read margin of the nonvolatile memory device to be maximized. In FIG. 4A, a first read margin 408 represents a read margin when reading the data having the logical state of "1" in the memory cell, where the read margin is a difference between the read current 402 and the reference current 404. Likewise, a second read margin 410 represents a read margin when reading the data having the logical state of "0" in the memory cell, where the read margin is a difference between the reference current 404 and the read current 406.

It should be appreciated that in conventional reference signal generators not utilizing the first and second circuits described herein, the temperature slope of the reference current is significantly different than the temperature slopes of the read currents flowing through the memory cell. This causes the conventional reference signal generators to have reduced read margins, and this is undesirable. Such reduced read margins can lead to errors when reading data, a deterioration of nonvolatile memory device performance, and other reliability issues in the nonvolatile memory device. Using the reference signal generator described herein, the read margin is maximized, thus helping to prevent the aforementioned issues in the nonvolatile memory device. Further, by maximizing the read margin using the reference signal generator described herein, shallower erase depths and program depths are achieved, which help to improve endurance of the nonvolatile memory device.

Although the example of FIG. 4A shows the single reference current 404, other reference currents can be derived from the reference current 404 or generated in a manner similar to that described above for generating the reference current 404. As explained above, the reference current 404 is used in determining a logical state of data stored in the memory cell (e.g., a sense amplifier compares a sensing current flowing through the memory cell to the reference current 404 and determines the logical state of the data stored in the memory cell based on the comparison). The other reference currents are used, by contrast, to verify that a memory cell has been programmed or to verify that a memory cell has been erased.

To verify that a memory cell has been programmed, a maximum programmed cell current is set as the reference current. This reference current is known as a program verify (PV) reference current, and an example of such a PV reference current is illustrated in FIG. 4B at 434. If the cell has a current larger than the PV reference current, the cell is considered as not being programmed. To verify that a memory cell has been erased, a minimum erased cell current is set as the reference current. This reference current is known as an erase verify (EV) reference current, and an example of such an EV reference current is illustrated in FIG. 4B at 432. If the cell has a current smaller than the EV reference current, the cell is considered as not being erased.

The EV and PV reference currents 432, 434 are derived from the reference current 404 or generated in a manner similar to that described above for generating the reference current 404. As illustrated in FIG. 4B, the reference currents 404, 432, 434 have a same temperature slope. Thus, in an example, the EV and PV reference currents 432, 434 are generated based on the reference current 404 and have the same temperature slope as the reference current 404 but with a different magnitude. In the example, the EV and PV reference currents 432, 434 are generated by shifting the reference current 404 upwards and downwards.

Figure 5:
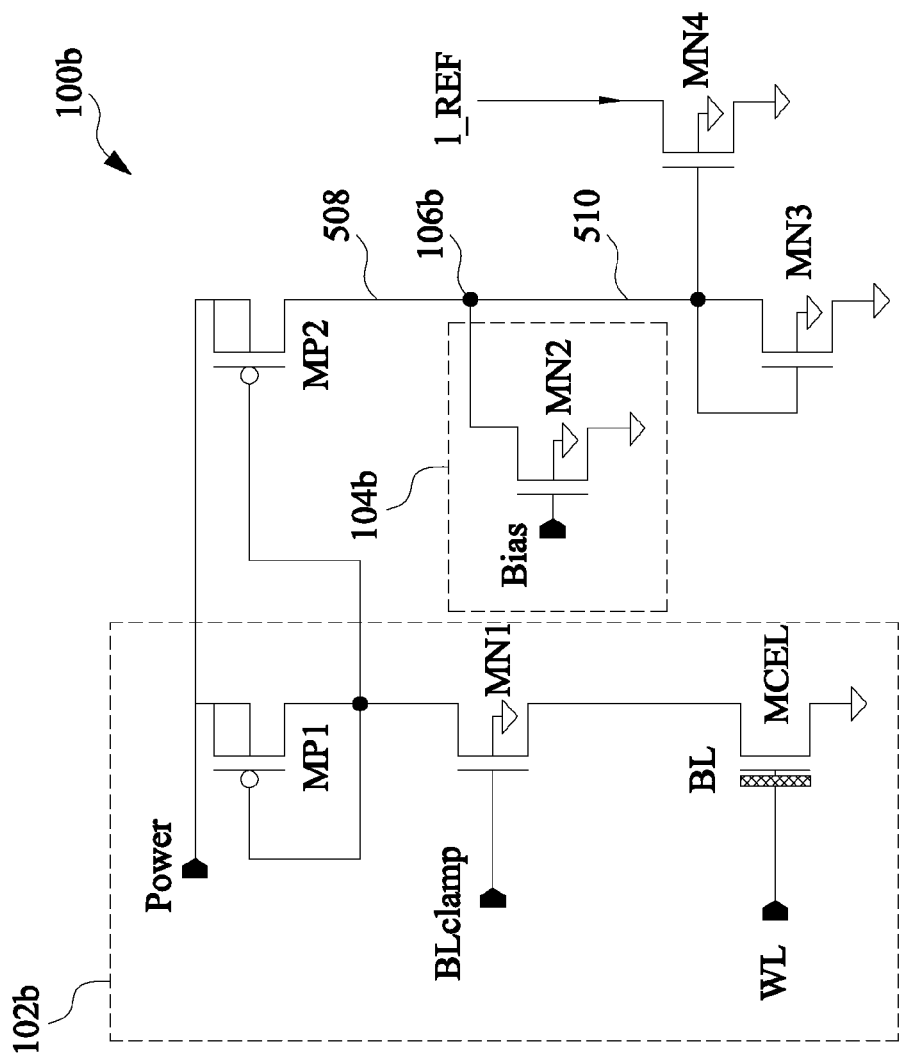
FIG. 5 depicts a schematic diagram of a reference signal generator, in accordance with some embodiments.

FIG. 5 depicts a schematic diagram of a reference signal generator 100b, in accordance with some embodiments. The reference signal generator 100b is configured to generate a reference current $I_{REF}$ that is used in reading data stored in a memory cell and includes a first circuit 102b, a second circuit 104b, and a current summation node 106b. The first circuit 102b is coupled to the current summation node 106b and includes a reference cell MCEL. The reference cell MCEL comprises a conventional transistor used in nonvolatile memory and includes a drain terminal, a source terminal, a floating gate, and a control gate. The first circuit 102b is configured to generate a first current that flows between the drain and source terminals of the reference cell MCEL.

The reference signal generator 100b further includes a current mirror that couples the first circuit 102b to the current summation node 106b. The current mirror causes the first current that flows between the drain and source terminals of the reference cell MCEL to be copied to a branch 508 that is coupled to the current summation node 106b. The copying of the first current causes the first current to flow into the current summation mode 106b via the branch 508.

The current mirror includes a first PMOS transistor MP1 included in the first circuit 102b. A source terminal of the first PMOS transistor MP1 is connected to a power supply voltage (i.e., labeled "Power" in the illustration of FIG. 5), and a gate terminal of the first PMOS transistor MP1 is connected to a drain terminal of the first PMOS transistor MP1. The current mirror also includes a second PMOS transistor MP2. A source terminal of the second PMOS transistor MP2 is connected to the power supply voltage, a gate terminal of the second PMOS transistor MP2 is connected to the gate terminal of the first PMOS transistor MP1, and a drain terminal of the second PMOS transistor MP2 is connected to the current summation node 106b. In an example, the power supply voltage is a first regulated voltage generated by one or more voltage regulators. Because the power supply voltage is generated by the one or more voltage regulators, this voltage is maintained at a substantially constant level.

In the reference signal generator 100b of FIG. 5, the first circuit 102b includes the first PMOS transistor MP1 and a first NMOS transistor MN1 connected in series. The drain terminal of the first PMOS transistor MP1 is connected to a drain terminal of the first NMOS transistor MN1, and a source terminal of the first NMOS transistor MN1 is connected to the drain terminal of the reference cell MCEL. The source terminal of the reference cell MCEL is connected to a ground reference voltage. A gate terminal of the first NMOS transistor MN1 is connected to a clamping voltage (i.e., labeled "BLclamp" in the illustration of FIG. 5), with the clamping voltage being a second regulated voltage generated by the one or more voltage regulators. Like the power supply voltage, the clamping voltage is maintained at a substantially constant level by the one or more voltage regulators.

A voltage on the drain terminal of the reference cell MCEL is referred to herein as a "bit-line bias" (e.g., due to the fact that the drain of a nonvolatile memory cell is generally coupled to a bit-line), and correspondingly, the drain terminal of the reference cell MCEL is labeled "BL" in FIG. 5. By applying the clamping voltage using the one or more voltage regulators, the clamping voltage is maintained at the substantially constant voltage level, and this causes the bit-line bias of the reference cell MCEL to also be maintained at a substantially constant voltage level. Maintaining the bit-line bias at the substantially constant voltage allows the first current flowing between the drain and source terminals of the reference cell MCEL to be substantially constant.

A voltage on the control gate of the reference cell MCEL is referred to herein as a "word-line bias" (e.g., due to the fact that the control gate of a nonvolatile memory cell is generally coupled to a word-line), and correspondingly, the control gate of the reference cell MCEL is labeled "WL" in FIG. 5. In an example, the word-line bias applied to the control gate of the reference cell MCEL is maintained at a substantially constant voltage level by the one or more voltage regulators. Maintaining the word-line bias at the substantially constant voltage level helps to keep the first current flowing through the reference cell MCEL at the constant level.

In the reference signal generator 100b of FIG. 5, the second circuit 104b includes a second NMOS transistor MN2, where a drain terminal of the second NMOS transistor MN2 is connected to the drain terminal of the second PMOS transistor MP2, and a source terminal of the second NMOS transistor MN2 is connected to the ground reference voltage. The second circuit 104b is configured to generate a second current, where the second current flows out of the current summation node 106b and between the drain terminal and the source terminal of the second NMOS transistor MN2. Based on the illustration of FIG. 5, it should be appreciated that the second circuit 104b includes only a single NMOS transistor and does not include a resistor or other additional elements.

As shown in FIG. 5, a gate terminal of the second NMOS transistor MN2 receives a bias voltage (i.e., labeled "Bias" in the example of FIG. 5), and a temperature dependence of the second current is based on the bias voltage. Specifically, the bias voltage is used to control a temperature slope of the second current, where the temperature slope of the second current defines a rate of change of the second current with respect to the temperature of the nonvolatile memory device. In an example, the bias voltage is a third regulated voltage generated by the one or more voltage regulators and maintained at a substantially constant level.

The temperature slope of the second current is also based on physical characteristics of the second NMOS transistor MN2. In an example, these physical characteristics include a channel length of the transistor and a width of the transistor. These characteristics and others of the second NMOS transistor MN2 are designed to be similar to characteristics of the reference cell MCEL. A transistor type (e.g., identifying whether the transistor is PMOS or NMOS) of the second NMOS transistor MN2 is the same as a transistor type of the reference cell MCEL. This is illustrated in FIG. 2, which shows both the second NMOS transistor MN2 and the reference cell MCEL as being n-type metal-oxide-semiconductor field-effect transistor (MOSFET) transistors. The second NMOS transistor MN2 and the reference cell MCEL are fabricated on a same wafer and using same process parameters. Further, as noted above, physical dimensions, including channel length and transistor width, of the NMOS transistor MN2 and the reference cell MCEL are approximately equal. Any physical differences between the second NMOS transistor MN2 and the reference cell MCEL are naturally occurring variation in attributes resulting from the fabrication of the components. By designing the second NMOS transistor MN2 and the reference cell MCEL to have such similar characteristics and by forming these transistors on the same wafer using same process parameters, variation in the reference current $I_{REF}$ due to process corners is eliminated or lessened.

The use of the one or more voltage regulators to generate the first, second, and third regulated voltages described herein makes the reference current $I_{REF}$ independent of power variation in the reference signal generator 100b and helps to eliminate voltage corners (i.e., voltage variation effects) that could otherwise cause unwanted variation in the reference current $I_{REF}$. Although the first, second, and third voltages are described herein as being generated by the one or more voltage regulators, in an example, a single voltage regulator is used in generating the first, second, and third reference voltages. For example, the clamping voltage, bias voltage, and power supply voltage may each be equal to 1.3 V, with the regulated 1.3 V being maintained at a substantially constant level by a single power regulator. In other examples, the first, second, and third voltages are different voltages and are provided by multiple voltage regulators or multiple power regulators.

In FIG. 5, a second branch 510 is coupled to the current summation node 106b. The reference current $I_{REF}$ flows into the second branch from the current summation node 106b and is equal to a difference between the first current that flows into the current summation node 106b and the second current that flows out of the current summation node 106b. The reference signal generator 100b further includes a third NMOS transistor MN3, where a drain terminal of the third NMOS transistor MN3 is coupled to the drain terminal of the second NMOS transistor MN2, a source terminal of the third NMOS transistor MN3 is coupled to the ground reference voltage, and a gate terminal of the third NMOS transistor MN3 is coupled to the drain terminal of the third NMOS transistor MN3. A fourth NMOS transistor MN4 includes a source terminal connected to the ground reference voltage, and a gate terminal connected to the drain terminal of the third NMOS transistor MN3. The third and fourth NMOS transistors MN3, MN4 implement a second current mirror, such that a current flow in the third NMOS transistor MN3 is copied to the fourth NMOS transistor MN4. The current flow copied from the third NMOS transistor MN3 to the fourth NMOS transistor MN4 is the reference current $I_{REF}$.

Although the example of FIG. 5 depicts the single reference cell MCEL, in other examples, multiple reference cells are used. In such other examples, currents flowing through the multiple reference cells are generated, and the first current provided to the current summation node 106b is an average of the currents flowing through the multiple reference cells. In this manner, if there is substantial variation in any one of the multiple reference cells, such variation is effectively eliminated in the first current received by the current summation node 106b, due to the averaging. The reference signal generators depicted in FIGS. 1, 2, and 5 are examples only, and it should be understood that the reference signal generator described herein can be implemented with various modifications. For example, the transistor types used in implementing the first and second circuits 102b, 104b of FIG. 5 are exemplary only, and in other examples, these circuits are implemented with different transistor types and/or other components.

Figure 6:
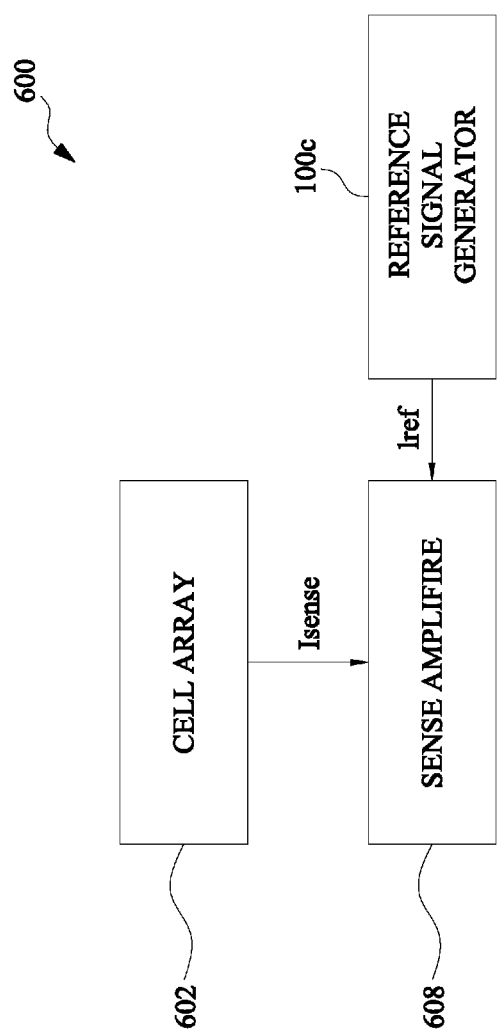
FIG. 6 is a block diagram of a nonvolatile memory device, in accordance with some embodiments.

FIG. 6 is a block diagram of a nonvolatile memory device 600, in accordance with some embodiments. The nonvolatile memory device 600 includes a cell array 602, a sense amplifier 608, and a reference signal generator 100c. The nonvolatile memory device 600 senses data stored in the cell array 602 using a reference current Iref provided from the reference signal generator 100c. Embodiments of the reference signal generator 100c are discussed above with reference to FIGS. 1-5. It should be understood that the nonvolatile memory device 600 of FIG. 6 may include additional other components (e.g., row decoder, column selector, etc.) not depicted in the example of FIG. 6.

The cell array 602 comprises a plurality of nonvolatile memory cells connected to word-lines and bit-lines, with multiple of the memory cells being connected in parallel to each bit-line. In a read operation, a first voltage is applied to a word-line, and a second voltage is applied to a bit-line. When these voltages are applied, a memory cell is selected for reading, and the logical value of data stored in the selected memory cell is determined based on a sensing current flowing through the memory cell. In a read operation, a sensing current Isense flowing into a drain of the selected memory cell is transmitted to the sense amplifier 608, and a reference current Iref is transmitted to the sense amplifier 608 from the reference signal generator 100c. The sense amplifier 608 then compares the sensing current Isense to the reference current Iref and determines a logical state of the data stored in the selected memory cell according to the comparison.

Figure 7:
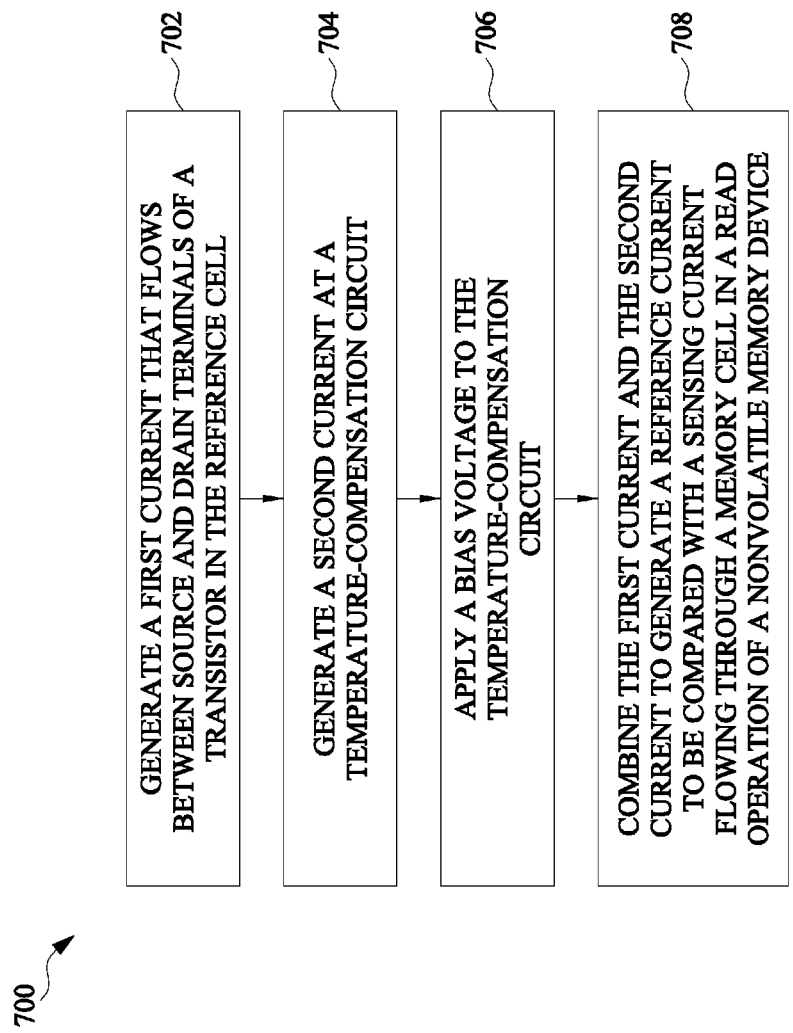
FIG. 7 is a flow diagram depicting steps of a method for setting a reference current of a nonvolatile memory device, in accordance with some embodiments.

FIG. 7 is a flow diagram 700 depicting steps of a method for setting a reference current of a nonvolatile memory device, in accordance with some embodiments. At 702, a first current that flows between source and drain terminals of a transistor in a reference cell is generated, where the reference cell has a floating gate and a control gate. At 704, a second current is generated at a temperature-compensation circuit. The generating of the second current includes, at 706, applying a bias voltage to the temperature-compensation circuit, where a temperature dependence of the second current is based on the bias voltage. At 708, the first current and the second current are combined to generate a reference current to be compared with a sensing current flowing through a memory cell in a read operation of a nonvolatile memory device. The bias voltage applied to the temperature-compensation circuit causes a temperature slope of the reference current to approximate that of the sensing current, with the temperature slope defining a rate of change of a respective current with respect to a temperature of the nonvolatile memory device.

The present disclosure is directed to a nonvolatile memory device and a method for setting a reference current of a nonvolatile memory device. As described above, a reference signal generator is configured to generate a reference current for reading data stored in a memory cell of the nonvolatile memory device and includes the following components: (i) a reference cell current source, and (ii) a temperature-compensation current source. The reference cell current source includes a reference cell for generating a first current that has a similar behavior as current flowing through the memory cell. The temperature-compensation current source generates a second current that is used to adjust a temperature trend of the first current. Specifically, the first and second currents are combined (e.g., via an addition or subtraction operation) to generate the reference current, with the reference current having a temperature slope that approximates that of the current flowing through the memory cell. The reference current having such a temperature slope maximizes a read margin of the nonvolatile memory device.

In an embodiment of a nonvolatile memory device, the nonvolatile memory device includes a cell array including a memory cell. The nonvolatile memory device also includes a reference signal generator configured to generate a reference current for reading data stored in the memory cell. The reference signal generator includes a first circuit coupled to a current summation node and having a reference cell, where the reference cell has a floating gate and a control gate. The first circuit is configured to generate a first current that flows between drain and source terminals of a transistor in the reference cell. The reference signal generator also includes a second circuit coupled to the current summation node and configured to generate a second current that is a temperature-dependent current. The current summation node is configured to combine the first and second currents to generate the reference current that tracks a temperature trend of a current flowing through the memory cell.

Another embodiment of a nonvolatile memory device includes a memory cell and a reference signal generator configured to generate a reference current for reading data stored in the memory cell. The reference signal generator comprises a first circuit including a reference cell, where the reference cell has physical characteristics substantially identical to those of the memory cell. The first circuit is configured to generate a first current that flows between drain and source terminals of a transistor in the reference cell. The reference signal generator also includes a second circuit comprising a complementary-to-absolute temperature (CTAT) current source without a resistor. The CTAT current source generates a second current that decreases with increasing temperature of the nonvolatile memory device. The reference signal generator further includes a current summation node configured to generate the reference current based on a summation of the first and second currents or based on a difference between the first and second currents. A temperature slope of the reference current approximates that of a current flowing through the memory cell, with the temperature slope defining a rate of change of a respective current with respect to a temperature of the nonvolatile memory device.

In an embodiment of a method for setting a reference current of a nonvolatile memory device, a first current that flows between source and drain terminals of a transistor in a reference cell is generated, where the reference cell has a floating gate and a control gate. A second current is generated at a temperature-compensation circuit, and the generating of the second current includes applying a bias voltage to the temperature-compensation circuit, where a temperature dependence of the second current is based on the bias voltage. The first current and the second current are combined to generate a reference current to be compared with a sensing current flowing through the memory cell in a read operation of a nonvolatile memory device. The bias voltage applied to the temperature-compensation circuit causes a temperature slope of the reference current to approximate that of the sensing current, with the temperature slope defining a rate of change of a respective current with respect to a temperature of the nonvolatile memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A nonvolatile memory device comprising:
a cell array including a memory cell; and
a reference signal generator configured to generate a reference current for reading data stored in the memory cell, the reference signal generator comprising:
a first circuit coupled to a current summation node and including a reference cell, the reference cell having a floating gate and a control gate, wherein the first circuit is configured to generate a first current that flows between drain and source terminals of a transistor in the reference cell,
a second circuit coupled to the current summation node and configured to generate a second current that is a temperature-dependent current, and
the current summation node configured to combine the first and second currents to generate the reference current that tracks a temperature trend of a current flowing through the memory cell.

2. The nonvolatile memory device of claim 1, wherein a temperature slope of the reference current approximates that of the current flowing through the memory cell, the temperature slope defining a rate of change of a respective current with respect to a temperature of the nonvolatile memory device.

3. The nonvolatile memory device of claim 1, wherein the second circuit comprises a complementary-to-absolute temperature (CTAT) current source without a resistor, the CTAT current source generating the second current that decreases with increasing temperature of the nonvolatile memory device.

4. The nonvolatile memory device of claim 1, further comprising:
a bias circuit configured to provide a bias voltage to the second circuit, wherein a temperature dependence of the second current is based on the bias voltage.

5. The nonvolatile memory device of claim 4, wherein the bias circuit comprises a voltage regulator configured to generate the bias voltage, the bias voltage being a regulated voltage that is maintained at a substantially constant level.

6. The nonvolatile memory device of claim 4, wherein the bias voltage applied to the second circuit controls a temperature slope of the second current, the temperature slope of the second current defining a rate of change of the second current with respect to the temperature of the nonvolatile memory device.

7. The nonvolatile memory device of claim 4, wherein the reference signal generator comprises:
one or more voltage regulators configured to generate one or more regulated voltages, wherein the one or more regulated voltages provide:
a power supply voltage to the reference signal generator;
the bias voltage to the second circuit; and
a clamping voltage to a gate terminal of a metal-oxide-semiconductor field-effect transistor (MOSFET) of the first circuit, the clamping voltage causing a voltage at the drain terminal of the reference cell to be maintained at a constant voltage level.

8. The nonvolatile memory device of claim 1, wherein the reference current is configured to maximize a read margin of the nonvolatile memory device, the read margin being a difference between the reference current and the current flowing through the memory cell during a read operation.

9. The nonvolatile memory device of claim 1, wherein the reference current comprises a difference between the first and second currents.

10. The nonvolatile memory device of claim 1, wherein physical characteristics of the reference cell are substantially identical to physical characteristics to the memory cell.

11. The nonvolatile memory device of claim 1, wherein the second circuit comprises a single PMOS or NMOS transistor, wherein the second circuit does not include a resistor, and wherein the second circuit does not include a second PMOS or NMOS transistor.

12. The nonvolatile memory device of claim 11,
wherein a transistor type of the single PMOS or NMOS transistor is same as a transistor type of the reference cell, the transistor type indicating whether a respective component is NMOS or PMOS,
wherein dimensions of the single PMOS or NMOS transistor are approximately equal to dimensions of the reference cell, and
wherein the single PMOS or NMOS transistor is fabricated on a same wafer as the reference cell, the PMOS or NMOS transistor and the reference cell being fabricated using same process parameters.

13. The nonvolatile memory device of claim 1, wherein the reference signal generator further includes:
a current mirror that couples the first circuit to the current summation node, the current mirror causing the first current that flows between the drain and source terminals of the reference cell to be copied to a branch that is coupled to the current summation node, wherein the copying of the first current causes the first current to flow into the current summation mode via the branch; and
a bias circuit configured to provide a bias voltage to the second circuit, wherein a temperature dependence of the second current is based on the bias voltage.

14. The nonvolatile memory device of claim 13, wherein the current mirror comprises:
a first PMOS transistor included in the first circuit, wherein a source terminal of the first PMOS transistor is coupled to a power supply voltage, and a gate terminal of the first PMOS transistor is coupled to a drain terminal of the first PMOS transistor; and
a second PMOS transistor, wherein a source terminal of the second PMOS transistor is coupled to the power supply voltage, a gate terminal of the second PMOS transistor is coupled to the gate terminal of the first PMOS transistor, and a drain terminal of the second PMOS transistor is coupled to the current summation node,
wherein the power supply voltage is a regulated voltage generated by one or more voltage regulators.

15. The nonvolatile memory device of claim 14, wherein the first circuit includes:
the first PMOS transistor and a first NMOS transistor coupled in series, wherein the drain terminal of the first PMOS transistor is coupled to a drain terminal of the first NMOS transistor, and a source terminal of the first NMOS transistor is coupled to the drain terminal of the reference cell,
wherein the source terminal of the reference cell is coupled to a ground reference voltage, and wherein a gate terminal of the first NMOS transistor is coupled to a clamping voltage, the clamping voltage being a second regulated voltage generated by the one or more voltage regulators.

16. The nonvolatile memory device of claim 15, wherein the second circuit includes:
a second NMOS transistor, wherein a drain terminal of the second NMOS transistor is coupled to the drain terminal of the second PMOS transistor, and a source terminal of the second NMOS transistor is coupled to the ground reference voltage,
wherein the second current flows out of the current summation node and between the drain terminal and the source terminal of the second NMOS transistor, and
wherein a gate terminal of the second NMOS transistor receives the bias voltage from the bias circuit, the bias voltage being a third regulated voltage generated by the one or more voltage regulators.

17. The nonvolatile memory device of claim 16, further comprising:
a second branch coupled to the current summation node, wherein the reference current flows into the second branch from the current summation node and is equal to a difference between the first current that flows into the current summation node and the second current that flows out of the current summation node.

18. The nonvolatile memory device of claim 16, further comprising:
a third NMOS transistor, wherein a drain terminal of the third NMOS transistor is coupled to the drain terminal of the second NMOS transistor, a source terminal of the third NMOS transistor is coupled to the ground reference voltage, and a gate terminal of the third NMOS transistor is coupled to the drain terminal of the third NMOS transistor; and
a fourth NMOS transistor, wherein a source terminal of the fourth NMOS transistor is coupled to the ground reference voltage, and a gate terminal of the fourth NMOS transistor is coupled to the drain terminal of the third NMOS transistor,
wherein a current flow in the third NMOS transistor is copied to the fourth NMOS transistor, the current flow copied to the fourth NMOS transistor being the reference current.

19. The nonvolatile memory device of claim 1, wherein the reference signal generator comprises:
a voltage regulator configured to provide a clamping voltage to a gate terminal of a metal-oxide-semiconductor field-effect transistor (MOSFET) of the first circuit, the clamping voltage causing a voltage at the drain terminal of the reference cell to be maintained at a constant voltage level.

20. The nonvolatile memory device of claim 1, wherein a temperature slope of the second current is configurable based on a bias voltage received at the second circuit.

21. A nonvolatile memory device comprising:
a memory cell; and
a reference signal generator configured to generate a reference current for reading data stored in the memory cell, the reference signal generator comprising:
a first circuit including a reference cell, the reference cell having physical characteristics substantially identical to those of the memory cell, wherein the first circuit is configured to generate a first current that flows between drain and source terminals of a transistor in the reference cell,
a second circuit comprising a complementary-to-absolute temperature (CTAT) current source without a resistor, the CTAT current source generating a second current that decreases with increasing temperature of the nonvolatile memory device, and
a current summation node configured to generate the reference current based on a summation of the first and second currents or based on a difference between the first and second currents, wherein a temperature slope of the reference current approximates that of a current flowing through the memory cell, the temperature slope defining a rate of change of a respective current with respect to a temperature of the nonvolatile memory device.

22. The nonvolatile memory device of claim 21, wherein the reference signal generator comprises:

a voltage regulator configured to provide a clamping voltage to a gate terminal of a metal-oxide-semiconductor field-effect transistor (MOSFET) of the first circuit, the clamping voltage causing a voltage at the drain terminal of the reference cell to be maintained at a constant voltage level.

23. The nonvolatile memory device of claim 21, wherein a temperature slope of the second current is configurable based on a bias voltage received at the second circuit.

24. A nonvolatile memory device comprising:

a memory cell; and a reference signal generator configured to generate a reference current for reading data stored in the memory cell, the reference signal generator comprising:

a first circuit coupled to a current summation node and configured to generate a first current, a second circuit coupled to the current summation node and configured to generate a second current that is a temperature-dependent current, and the current summation node configured to combine the first and second currents to generate the reference current that tracks a temperature trend of a current flowing through the memory cell.

25. The nonvolatile memory device of claim 24, wherein the reference signal generator comprises:

a voltage regulator configured to provide a clamping voltage to a gate terminal of a metal-oxide-semiconductor field-effect transistor (MOSFET) of the first circuit, the clamping voltage causing a voltage at a drain terminal of a reference cell of the first circuit to be maintained at a constant voltage level.

26. The nonvolatile memory device of claim 24, wherein a temperature slope of the second current is configurable based on a bias voltage received at the second circuit.

* * * * *